United States Patent
Kuo et al.

(10) Patent No.: US 10,321,565 B2
(45) Date of Patent: Jun. 11, 2019

(54) PRINTED CIRCUIT BOARD ASSEMBLY AND ASSEMBLING METHOD THEREOF

(71) Applicant: DELTA ELECTRONICS, INC., Taoyuan (TW)

(72) Inventors: Ching-Chi Kuo, Taoyuan (TW); Yi-Hwa Hsieh, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 5 days.

(21) Appl. No.: 15/667,964

(22) Filed: Aug. 3, 2017

(65) Prior Publication Data
US 2018/0352655 A1 Dec. 6, 2018

(30) Foreign Application Priority Data
Jun. 2, 2017 (CN) .......................... 2017 1 0407516

(51) Int. Cl.
| | |
|---|---|
| H05K 1/02 | (2006.01) |
| H05K 1/11 | (2006.01) |
| H05K 1/18 | (2006.01) |
| H05K 3/30 | (2006.01) |
| H05K 7/20 | (2006.01) |
| H05K 3/34 | (2006.01) |

(52) U.S. Cl.
CPC ............ *H05K 1/115* (2013.01); *H05K 1/181* (2013.01); *H05K 3/301* (2013.01); *H05K 3/303* (2013.01); *H05K 3/306* (2013.01); *H05K 7/209* (2013.01); *H05K 7/20445* (2013.01); *H05K 1/0203* (2013.01); *H05K 3/3447* (2013.01)

(58) Field of Classification Search
CPC ...... H05K 1/0203; H05K 1/0204; H05K 1/18; H05K 1/184; H05K 1/115; H05K 3/303; H05K 3/306; H05K 1/181
See application file for complete search history.

(56) References Cited

U.S. PATENT DOCUMENTS 8,040,677 B2 * 10/2011 Lee .................... H05K 7/20963
361/704
8,089,768 B2 * 1/2012 Mauder ................ G02B 6/4494
165/104.33
2003/0117774 A1 * 6/2003 Privett ................... H01H 9/061
361/704

(Continued)

FOREIGN PATENT DOCUMENTS

CN 100471373 C 3/2009
CN 201243428 Y 5/2009

*Primary Examiner* — Ishwarbhai B Patel
(74) *Attorney, Agent, or Firm* — Kirton McConkie; Evan R. Witt

(57) ABSTRACT

A printed circuit board assembly includes a printed circuit board, at least one electronic device, a holder and a heat-dissipation device. The printed circuit board includes at least one first through hole. The electronic device includes a first surface, a second surface and at least one pin. The first surface and the second surface are opposite to each other, and the pin passes through the first through hole of the printed circuit board and is inserted on the printed circuit board. The holder is disposed between the printed circuit board and the electronic device. The holder includes a supporting surface sustaining the first surface of the electronic device. The heat-dissipation device includes a heat-dissipation surface attached to the second surface of the electronic device.

18 Claims, 12 Drawing Sheets

(56) References Cited

U.S. PATENT DOCUMENTS

2015/0146375 A1* 5/2015 Lu .................. H05K 7/1432
  361/695
2018/0019186 A1* 1/2018 Kikugawa .......... H01L 21/4882

* cited by examiner

```
┌─────────────────────────────────────────────────────────┐
│   Providing a printed circuit board, at least one       │
│   electronic device, a holder and a heat-dissipation    │
│   device, wherein the printed circuit board includes    │
│   at least one first through hole, the electronic       │ ─── S1
│   device includes a first surface, a second surface     │
│   and at least one pin, the first surface and the       │
│   second surface are opposite to each other, the        │
│   holder includes a supporting surface, and the         │
│   heat-dissipation device includes a heat-dissipation   │
│   surface.                                              │
└─────────────────────────────────────────────────────────┘
                           │
                           ▼
┌─────────────────────────────────────────────────────────┐
│   Placing the holder on the printed circuit board,      │
│   attaching the first surface of the electronic device  │
│   to the supporting surface of the holder, and          │
│   inserting the pin of the electronic device through    │ ─── S2
│   the first through hole, so that the holder is         │
│   disposed between the printed circuit board and the    │
│   first surface of the electronic device and sustains   │
│   the first surface of the electronic device.           │
└─────────────────────────────────────────────────────────┘
                           │
                           ▼
┌─────────────────────────────────────────────────────────┐
│   Fixing the pin of the electronic device on the        │ ─── S3
│   printed circuit board.                                │
└─────────────────────────────────────────────────────────┘
                           │
                           ▼
┌─────────────────────────────────────────────────────────┐
│   Fastening the printed circuit board on the            │
│   heat-dissipation device, wherein the second surface   │ ─── S4
│   of the electronic device is attached to the           │
│   heat-dissipation surface.                             │
└─────────────────────────────────────────────────────────┘
```

FIG. 12

PRINTED CIRCUIT BOARD ASSEMBLY AND ASSEMBLING METHOD THEREOF

CROSS-REFERENCE TO RELATED APPLICATION

This application claims priority to China Patent Application No. 201710407516.1, filed on Jun. 2, 2017. The entire contents of the above-mentioned applications are incorporated herein by reference for all purposes.

FIELD OF THE INVENTION

The present invention relates to an assembly, and more particularly to a printed circuit board assembly and an assembling method thereof.

BACKGROUND OF THE INVENTION

With the increasing demand for the electronic products with the high power density, many electronic devices generate large amounts of heat during their operation. Therefore, an effective cooling system must be arranged therewith to dissipate the heat so that the overall performance is not affected by the heat accumulated therein. On the other hand, in order to meet the requirements of the high power density and the heat-dissipation, such electronic device is usually disposed on the printed circuit board by plugging pins thereon and also bending the pins to make the electronic device attached to the heat-dissipation surface of the heat-dissipation device. Thus the heat generated by the electronic device can be dissipated effectively by the heat-dissipation device.

Traditionally, the plug-in electronic device is fastened through the resilient fastening sheet and the screw, so that the electronic device is closely attached to the heat-dissipation surface of the heat-dissipation device. However, since the plug-in electronic device has been soldered on the printed circuit board, if the electronic device is further fastened through the resilient fastening sheet and the screw, it is easy to generate a tensile stress at the solder joints between the pins of the electronic device and the printed circuit board or damage the structural body of the electronic device, and thus affect the stability of the product. In addition, in order to perform the fastening process of the resilient fastening sheet and the screw, the installation location of the plug-in electronic device on the printed circuit board is further limited. For example, if the electronic device is horizontally plugged on the printed circuit board, it will occupy the layout area of the printed circuit board for other components, which results in the drawbacks of reducing the available utilization area of the printed circuit board, increasing the size of the product and decreasing the competitiveness of the product. Besides, while the electronic device is vertically plugged on the printed circuit board, it is essential to provide the resilient fastening sheet and the screw with sufficient operating space for performing the fastening process to assemble the electronic device and the heat-dissipation device together. Otherwise they cannot be assembled and produced. Thus, the space between the printed circuit board and the heat-dissipation device cannot be utilized easily, which also results in that the structural density of the system is reduced and the competitiveness of the product is decreased.

Therefore, there is a need of providing a printed circuit board assembly and an assembling method thereof to overcome the above drawbacks.

SUMMARY OF THE INVENTION

An object of the present invention is to provide a printed circuit board assembly and an assembling method thereof. By disposing a holder between the printed circuit board and the heat-dissipation device, the electronic device of the printed circuit board is correspondingly attached to the heat-dissipation surface of the heat-dissipation device to dissipate heat. It is easy to assemble the electronic device, the holder, the printed circuit board and the heat-dissipation device, and the holder is provided with sufficient strength to support the electronic device to be heat-dissipated after the assembling structure has been completely assembled. Consequently, the stress generated from the pins of the electronic device is eliminated and the electronic device is maintained at a fixed position. In addition, the printed circuit board can provide sufficient available area for other electronic components to be arranged unrestrictedly, so that the assembling structure of the printed circuit board and the heat-dissipation device is provided to achieve the purposes of effective heat-dissipation and high-density structure.

Another object of the present invention is to provide a printed circuit board assembly and an assembling method thereof. By disposing a holder between the printed circuit board and the heat-dissipation device, the electronic device is sustained by the holder firstly. Thus, while the pins of the electronic device are inserted on the printed circuit board and the electronic device is attached to the heat-dissipation surface of the heat-dissipation device for dissipating heat thereof, the stress generated from the pins of the electronic device is eliminated and the electronic device is maintained at a fixed position. In the meantime, the space between the printed circuit board and the heat-dissipation device is integrated by the support for improving the space utilization. Consequently, the assembling structure of the printed circuit board and the heat-dissipation device is provided to achieve the purposes of effective heat-dissipation and high-density structure.

In accordance with an aspect of the present invention, a printed circuit board assembly is provided. The printed circuit board assembly includes a printed circuit board, at least one electronic device, a holder and a heat-dissipation device. The printed circuit board includes at least one first through hole. The electronic device includes a first surface, a second surface and at least one pin. The first surface and the second surface are opposite to each other, and the pin passes through the first through hole of the printed circuit board and is inserted on the printed circuit board. The holder is disposed between the printed circuit board and the electronic device. The holder includes a supporting surface sustaining the first surface of the electronic device. The heat-dissipation device includes a heat-dissipation surface attached to the second surface of the electronic device.

In accordance with another aspect of the present invention, an assembling method for a printed circuit board is provided. The assembling method for the printed circuit board includes steps of: (a) providing a printed circuit board, at least one electronic device, a holder and a heat-dissipation device, wherein the printed circuit board includes at least one first through hole, the electronic device includes a first surface, a second surface and at least one pin, wherein the first surface and the second surface are opposite to each other, the holder includes a supporting surface, and the heat-dissipation device includes a heat-dissipation surface; (b) placing the holder on the printed circuit board, attaching the first surface of the electronic device to the supporting surface of the holder, and inserting the pin of the electronic device through the first through hole, so that the holder is disposed between the printed circuit board and the first surface of the electronic device and sustains the first surface of the electronic device; (c) fixing the pin of the electronic device on the printed circuit board; and (d) fastening the printed circuit board on the heat-dissipation device, wherein the second surface of the electronic device is attached to the heat-dissipation surface.

The above contents of the present invention will become more readily apparent to those ordinarily skilled in the art after reviewing the following detailed description and accompanying drawings, in which:

BRIEF DESCRIPTION OF THE DRAWINGS

FIG. 12 is a flow chart of an assembling method of a printed circuit board assembly according to a preferred embodiment of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
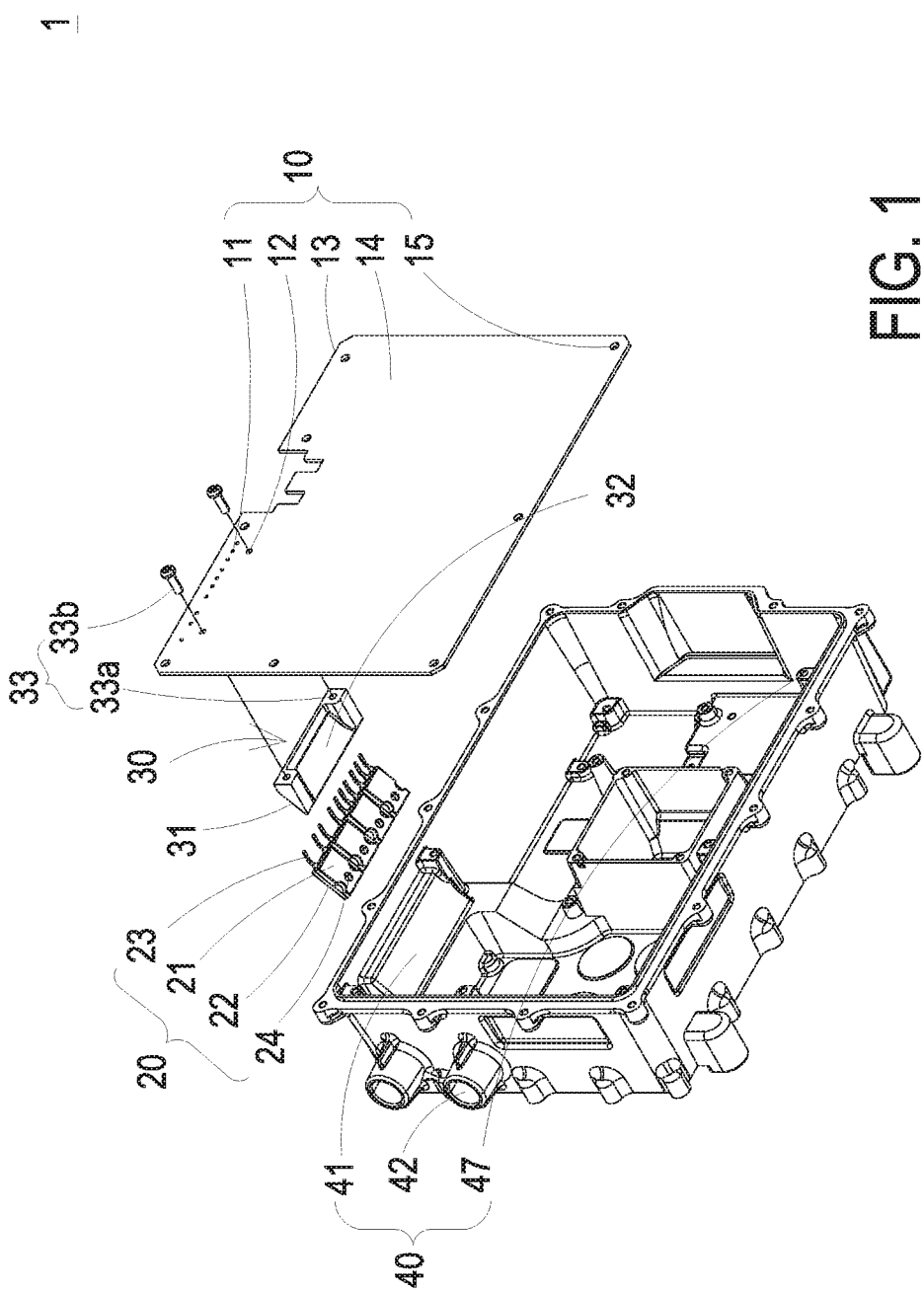
FIG. 1 is an exploded view illustrating a printed circuit board assembly according to a first preferred embodiment of the present invention.
Figure 2:
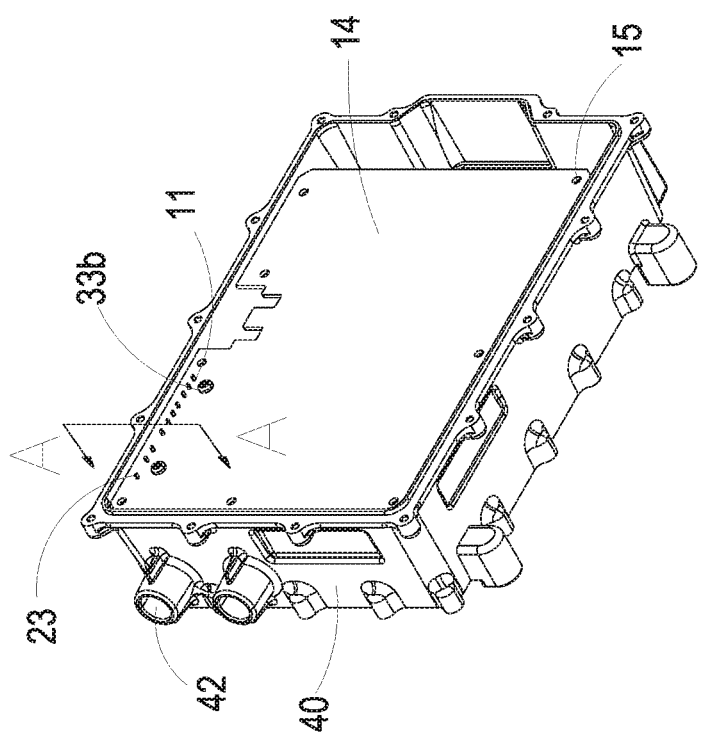
FIG. 2 is a perspective structural view illustrating the printed circuit board assembly according to the first preferred embodiment of the present invention.
Figure 3:
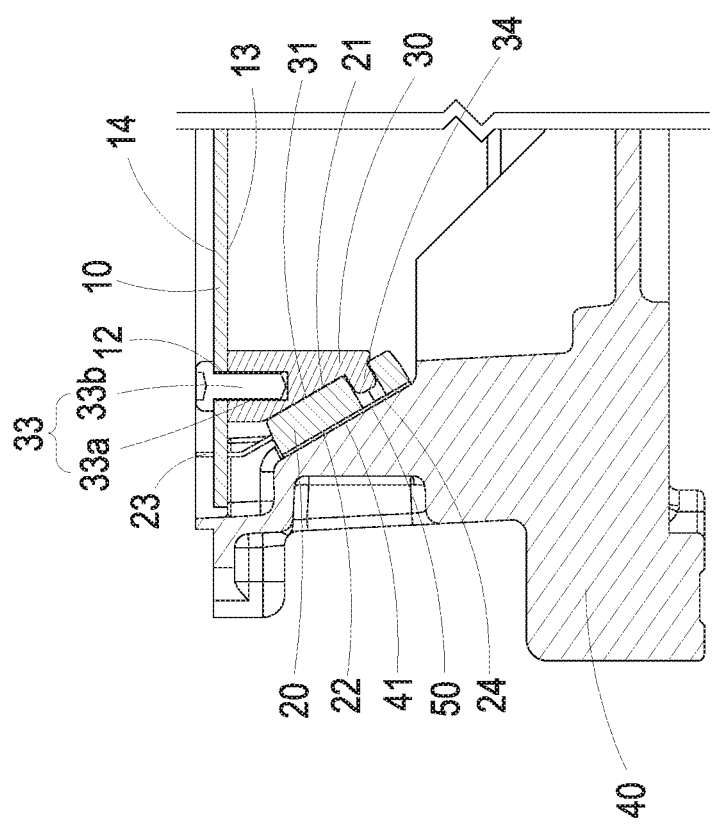
FIG. 3 is a cross-sectional view taken along line A-A of FIG. 2 and illustrating the printed circuit board assembly thereof.

FIG. 1 is an exploded view illustrating a printed circuit board assembly according to a first preferred embodiment of the present invention, FIG. 2 is a perspective structural view illustrating the printed circuit board assembly according to the first preferred embodiment of the present invention, and FIG. 3 is a cross-sectional view taken along line A-A of FIG. 2 and illustrating the printed circuit board assembly thereof. As shown in FIGS. 1 to 3, the printed circuit board assembly (hereafter referred as the assembly) 1 includes a printed circuit board 10, at least one electronic device 20, a holder 30 and a heat-dissipation device 40. The electronic device 20 includes a first surface 21, a second surface 22 and at least one pin 23. The first surface 21 and the second surface 22 are opposite to each other. The printed circuit board 10 includes at least one first through hole 11, at least one second through hole 12, a third surface 13 and a fourth surface 14. The third surface 13 and the fourth surface are opposite to each other. In the embodiment, the pins 23 of the electronic device 20 pass through the first through holes 11 of the printed circuit board 10 in the direction from the third surface 13 to the fourth surface 14 and are inserted on the printed circuit board 10. The holder 30 is disposed between the first surface 21 of the electronic device 20 and the third surface 13 of the printed circuit board 10. In the embodiment, the holder 30 includes a supporting surface 31 sustaining the first surface 21 of the electronic device 20 so that the holder 30 provides a sufficient strength to sustain the electronic device 20. Furthermore, the heat-dissipation device 40 includes a heat-dissipation surface 41 attached to the second surface 22 of the electronic device 20. Certainly, the heat-dissipation surface 41 of the heat-dissipation device 40 and the second surface 22 of the electronic device 20 are further adhered with each other by an interface material, for example but not limited to a thermally conductive adhesive 50. However, the present invention is not limited thereto and other applicable techniques are not redundantly described herein. In the embodiment, the electronic device 20 is a plug-in electronic device needing to be heat-dissipated. The electronic device 20 is firstly sustained by the holder 30 disposed between the printed circuit board 10 and the heat-dissipation device 40. The pins 23 of the electronic device 20 pass through the first through holes 11 of the printed circuit board 10 and are pre-inserted on the printed circuit board 10. Then, the pins 23 of the electronic device 20 are fixed on the printed circuit board 10 by for example but not limited to soldering. Consequently, the electronic device 20 is maintained on a fixed position to prevent the pins 23 of the electronic device 20 from generating the stress and being damaged while the electronic device 20 is attached to the heat-dissipation surface 41 of the heat-dissipation device 40 directly or by the thermally conductive adhesive 50. Thus, the purposes of the high density package and the effective heat-dissipation are achieved.

Figure 4B:
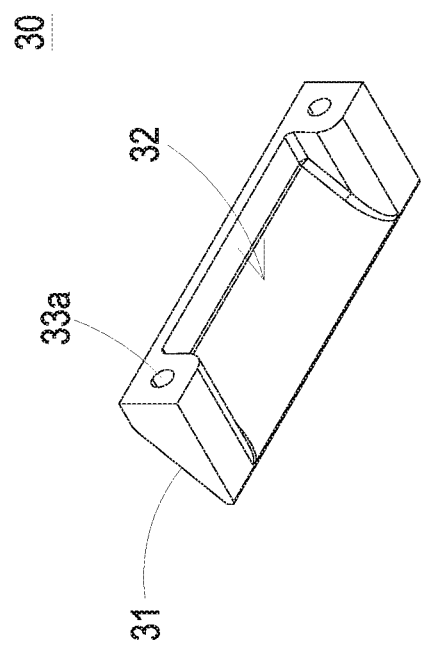
FIG. 4B is another exemplary structural view illustrating the holder of the printed circuit board assembly according to the first preferred embodiment of the present invention.
Figure 4A:
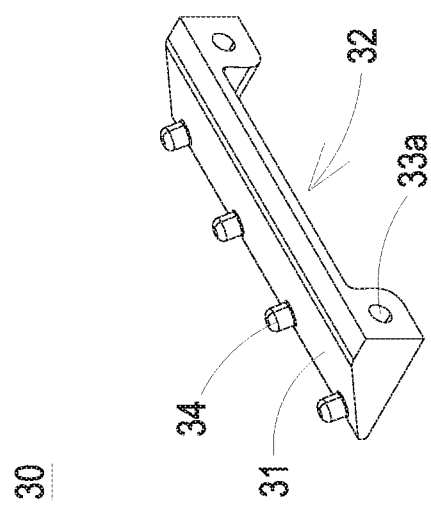
FIG. 4A is a perspective structural view illustrating the holder of the printed circuit board assembly according to the first preferred embodiment of the present invention.

FIGS. 4A and 4B are different perspective structural views illustrating the holder of the printed circuit board assembly according to the first preferred embodiment of the present invention, respectively. As shown in FIGS. 1, 2, 3, 4A and 4B, in the embodiment, the holder 30 further includes an accommodation space 32 constructed between the supporting surface 31 and the printed circuit board 10. The accommodation space 32 provides a sufficient space between the printed circuit board 10 and the supporting surface 31 for constructing other electronic components (not shown) by for example but not limited to the surface mount technology (SMT) on the third surface 13 while the holder 30 sustains the electronic device 20. Thus, the purpose of the high density package is achieved. On the other hand, the holder 30 includes a fastening set 33 jointing the holder 30 with the printed circuit board 10 together. In the embodiment, the fastening set 33 further includes at least one fastening hole 33a disposed on the holder 30 and at least one fastening piece 33b, and the printed circuit board 10 includes at least one second through hole 12. The fastening pieces 33b are engaged with the corresponding fastening holes 33a through the corresponding second through holes 12 in the direction from the fourth surface 14 to the third surface 13 and joint the holder 30 with the printed circuit board 10 together, so as to fasten the holder 30 on the printed circuit board 10. Besides, in the embodiment, the electronic device 20 further includes at least one first positioning portion 24 disposed on the first surface 21 and the holder 30 further includes at least one second positioning portion 34 disposed on the supporting surface 31. While the supporting surface 31 of the holder 30 sustains the first surface 21 of the electronic device 20, the first positioning portion 24 and the second positioning portion 34 are engaged with each other. Consequently, it provides the position for assembling and enhances the stability of the holder 30 for sustaining the electronic device 20 while the first surface 21 of the electronic device 20 is attached to the supporting surface 31 of the holder 30. In the embodiment, the first positioning portion 24 is a recess or a through hole, and the second positioning portion 34 is a projection. The first positioning portion 24 and the second positioning portion 34 fit to each other. Certainly, in another embodiment, the first positioning portion 24 and the second positioning portion 34 are a projection and a recess respectively and fit to each other. They are not essential technical features to limit the present invention, and other applicable techniques are not redundantly described herein.

On the other hand, in the embodiment, the printed circuit board 10 is further fastened on the heat-dissipation device 40. The printed circuit board 10 includes at least one first fastening component 15 and the heat-dissipation device 40 includes at least one second fastening component 47. The first fastening component 15 and the second fastening component 47 are corresponding to each other and configured to fasten the printed circuit board 10 on the heat-dissipation device 40. For example, the first fastening component 15 and the second fastening component 47 are a through hole and a screw hole, respectively, and fasten the printed circuit board 10 on the heat-dissipation device 40 by a screw (not shown). Certainly, the foregoing embodiments are merely illustrative and not the essential technical features to limit the present invention. The first fastening component 15 and the second fastening component 47 can fasten the printed circuit board 10 on the heat-dissipation device 40 by a hook, a latch, a buckle, an adhesive glue, or other fastening means. The present is not limited thereto and other applicable techniques are not redundantly described herein. In addition, in the embodiment, the heat-dissipation device 40 further includes a liquid-cooled heat-exchange module 42 thermally coupled to the heat-dissipation surface 41 for effectively dissipating the heat generated by the electronic device 20 through the second surface 22 thereof. However, they are not essential technical features to limit the present invention and other applicable techniques are not redundantly described herein.

Figure 5:
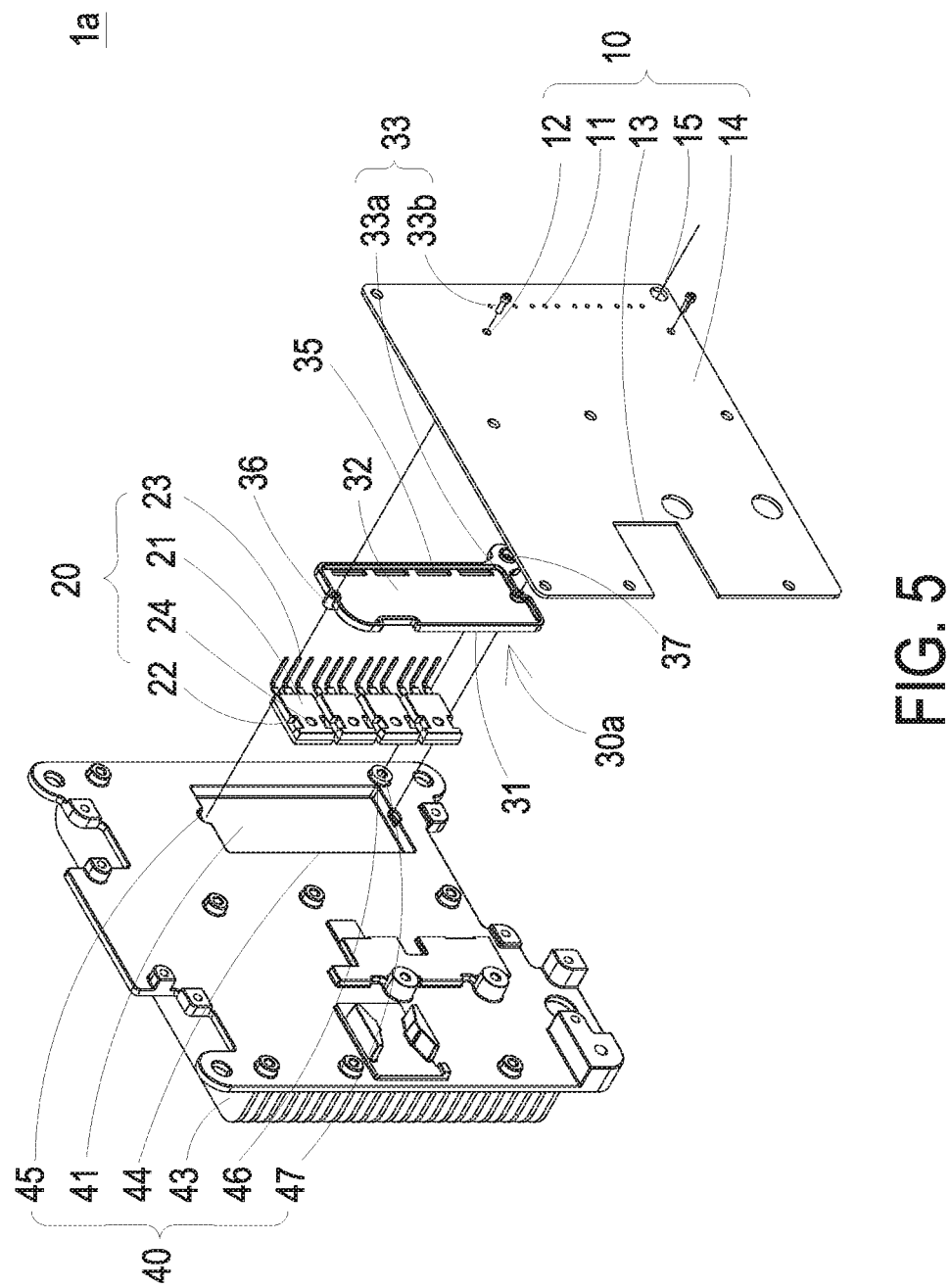
FIG. 5 is an exploded view illustrating a printed circuit board assembly according to a second preferred embodiment of the present invention.
Figure 6:
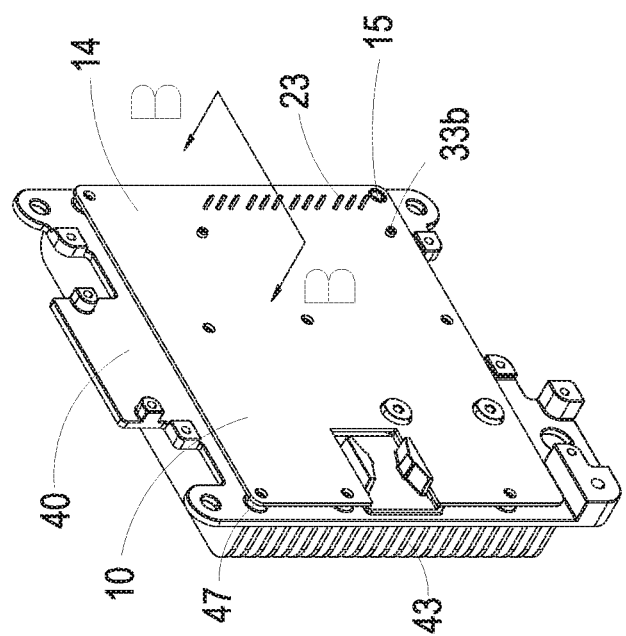
FIG. 6 is a perspective structural view illustrating the printed circuit board assembly according to the second preferred embodiment of the present invention.
Figure 7:
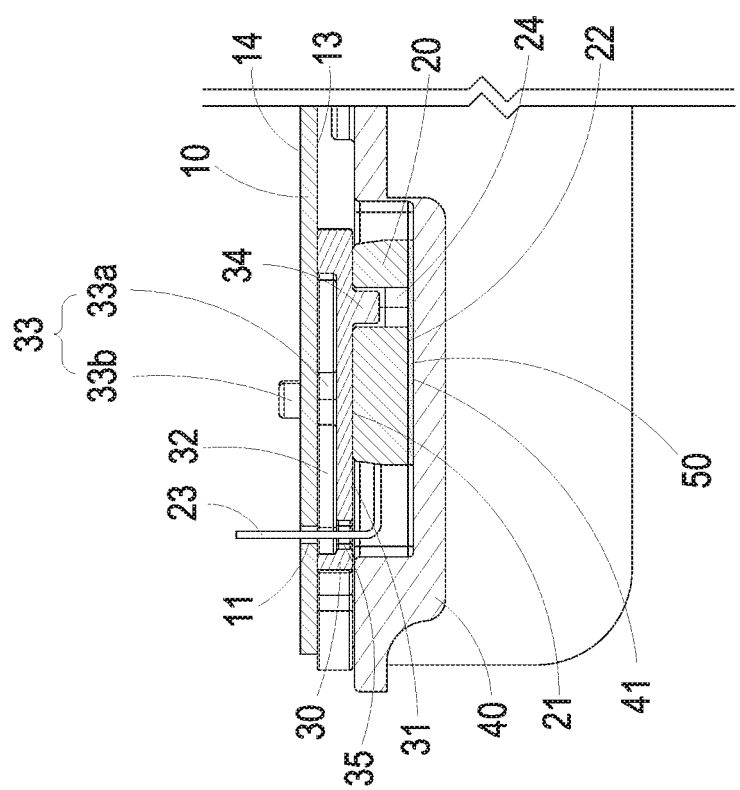
FIG. 7 is a cross-sectional view taken along line B-B of FIG. 6 and illustrating the printed circuit board assembly thereof.
Figure 8A:
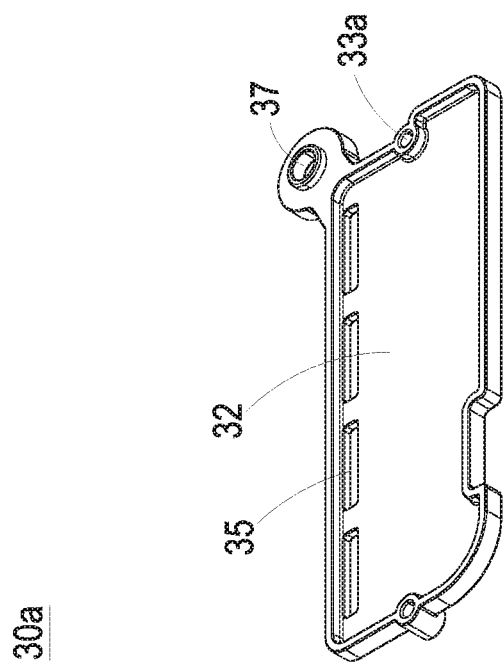
FIG. 8A is a perspective structural view illustrating the holder of the printed circuit board assembly according to the second preferred embodiment of the present invention.
Figure 8B:
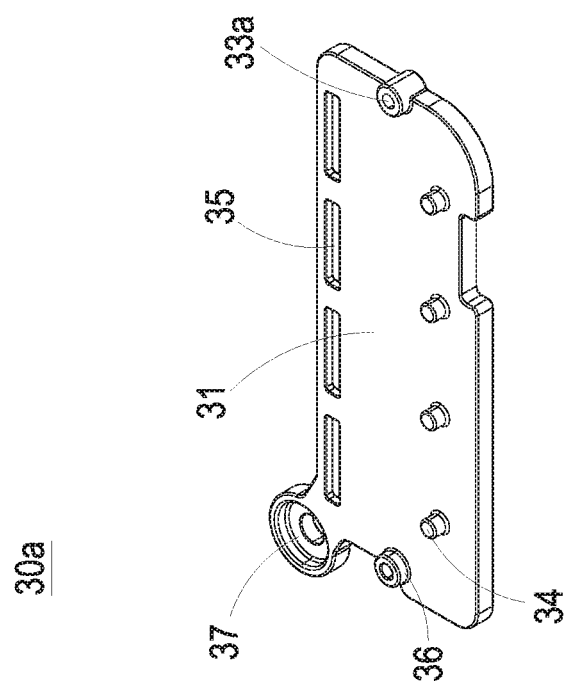
FIG. 8B is another exemplary structural view illustrating the holder of the printed circuit board assembly according to the second preferred embodiment of the present invention.

FIG. 5 is an exploded view illustrating a printed circuit board assembly according to a second preferred embodiment of the present invention, FIG. 6 is a perspective structural view illustrating the printed circuit board assembly according to the second preferred embodiment of the present invention, FIG. 7 is a cross-sectional view taken along line B-B of FIG. 6 and illustrating the printed circuit board assembly thereof, and FIGS. 8A and 8B are different perspective structural views illustrating the holder of the printed circuit board assembly according to the second preferred embodiment of the present invention, respectively. In the embodiment, the structures, elements and functions of the assembly 1a are similar to those of the assembly 1 in FIGS. 1 to 3, and are not redundantly described herein. Different from the assembly 1 of FIGS. 1 to 3, the holder 30a further includes at least one opening 35 disposed on the supporting surface 31 and receiving the at least one pin 23 of the electronic device 20 to enable the pin 23 to pass through the opening 35 and be inserted on the printed circuit board 10. It is noted that the number of the pins 23 with respect to each opening 35 is adjustable according to the practical requirements, and the opening 35 is further corresponding to the plural first through holes 11 of the printed circuit board 10, so as to provide the function of positioning. Certainly, the present invention is not limited thereto and other applicable techniques are not redundantly described herein. In the embodiment, the electronic device 20 to be heat-dissipated is sustained by the holder 30a disposed between the printed circuit board 10 and the heat-dissipation device 40, and meanwhile, the pins 23 of the electronic device 20 are bent and pass through the openings 35 of the holder 30a and the first through holes 11 of the printed circuit board 10 to pre-dispose the electronic device 20 on the printed circuit board 10. Then, the pins 23 of the electronic device 20 are fixed on the printed circuit board 10 by for example but not limited to a soldering method. Consequently, the electronic device 20 is maintained at a fixed position to prevent the pins 23 of the electronic device 20 from generating the stress and being damaged while the electronic device 20 is attached to the heat-dissipation surface 41 of the heat-dissipation device 40 directly or by the thermally conductive adhesive 50. Thus, the purposes of the high density package and the effective heat-dissipation are achieved.

On the other hand, the holder 30a further includes at least one third positioning portion 36 disposed near the outer edge of the supporting surface 31. The heat-dissipation device 40 further includes at least one fourth positioning portion 45 corresponding to the third positioning portion 36 and disposed near the outer edge of the receiving recess 44 of the heat-dissipation device 40. While the holder 30a sustains the first surface 21 of the electronic device 20 and the second surface 22 of the electronic device 20 is attached to the heat-dissipation surface 41, the third positioning portion 36 and the fourth positioning portion 45 are engaged with each other. It facilitates to assemble and position the holder 30a with the heat dissipation device 40 and enhance the stability of the assembled structure of the holder 30a and the heat-dissipation device 40. In the embodiment, the third positioning portion 36 and the fourth positioning portion 45 are a projection and a recess, respectively, and fit to each other. Certainly, in another embodiment, the third positioning portion 36 and the fourth positioning portion 45 can be a recess and a projection, respectively, and the disposed positions of them are adjustable according to the practical requirements. The present invention is not limited thereto. It is noted that, in the embodiment, the third positioning portion 36 and the fastening hole 33a of the holder 30a are integrated into one piece. The second positioning portion 34 of the holder 30a and the first positioning portion 24 of the electronic device 20 are engaged with each other and the third positioning portion 36 of the holder 30a and the fourth positioning portion 45 of the heat-dissipation device 40 are engaged with each other. Further, the fastening piece 33b passes through the second through hole 12 of the printed circuit board 10 and is engaged with the fastening hole 33a integrated with the third positioning portion 36 as one piece to connect the holder 30a and the printed circuit board 10. Thus, the printed circuit board 10, the holder 30a, the electronic device 20 and the heat-dissipation device 40 are assembled and positioned easily and firmly.

In addition, in the embodiment, the holder 30a further includes a fifth positioning portion 37 corresponding to the first fastening component 15 of the printed circuit board 10 and the second fastening component 47 of the heat-dissipation device 40 and disposed on the holder 30a. The heat-dissipation device 40 further includes a sixth positioning portion 46 corresponding to the fifth positioning portion 37 of the holder 30a. In the embodiment, the first fastening component 15 and the second fastening component 47 are a through hole and a screw hole, respectively. The sixth positioning portion 46 and the second fastening component 47 of the heat-dissipation device 40 are integrated as a one-piece cylinder. By a screw (not shown) passing through the through hole of the first fastening component 15 and the through hole of the fifth positioning portion 37 and engaged with the screw hole of the second fastening component 47 on the cylinder of the sixth positioning portion 46, the printed circuit board 10, the holder 30a and the heat-dissipation device 40 are positioned and assembled easily and firmly. On the other hand, different from the assembly 1 of FIGS. 1 to 3, in the embodiment, the heat-dissipation device 40 further includes a heat sink 43 thermally coupled to the heat-dissipation surface 41 and configured to effectively dissipate the heat generated by the electronic device 20 through the second surface 22. It is not an essential technical feature to limit the present invention and other applicable techniques are not redundantly described herein.

Figure 9:
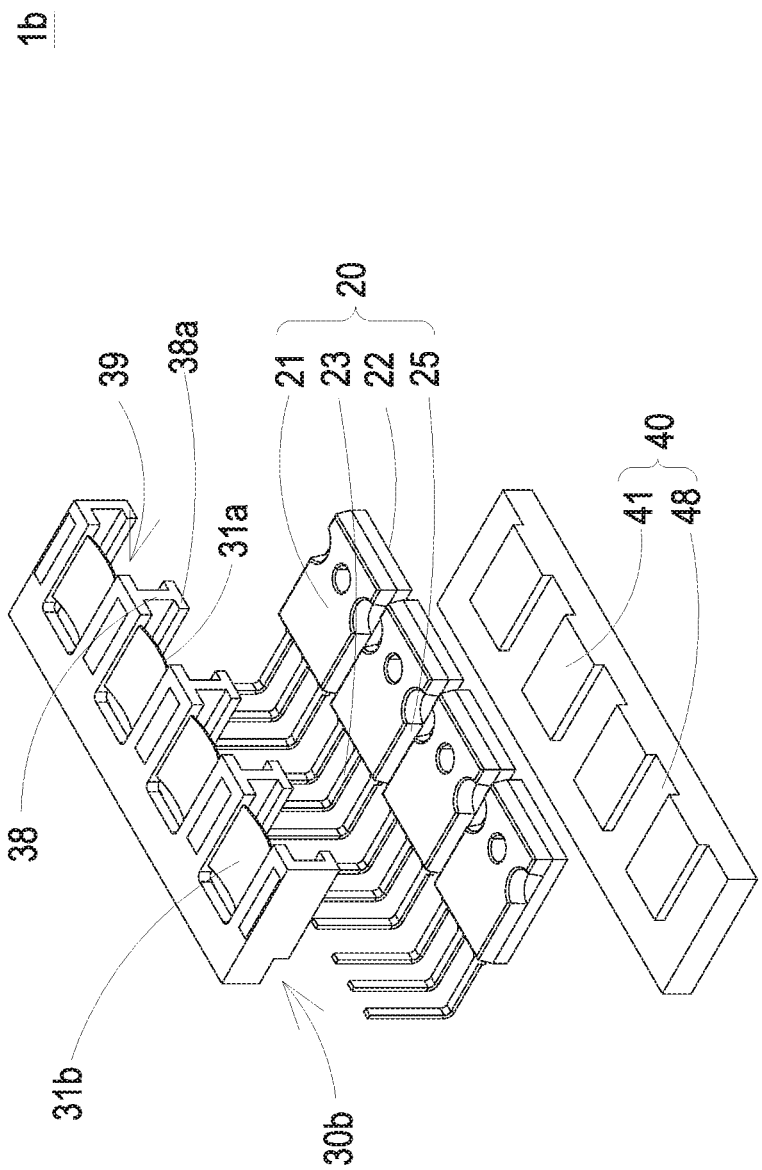
FIG. 9 is an exploded view illustrating a printed circuit board assembly according to a third preferred embodiment of the present invention.
Figure 10:
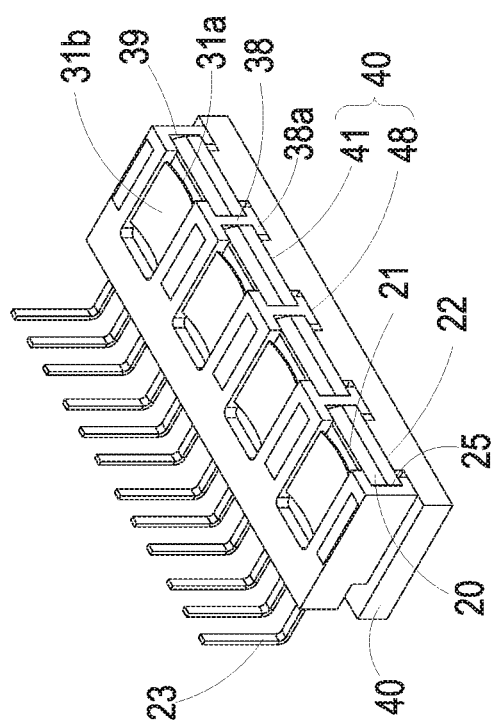
FIG. 10 is a perspective structural view illustrating the printed circuit board assembly according to the third preferred embodiment of the present invention.
Figure 11:
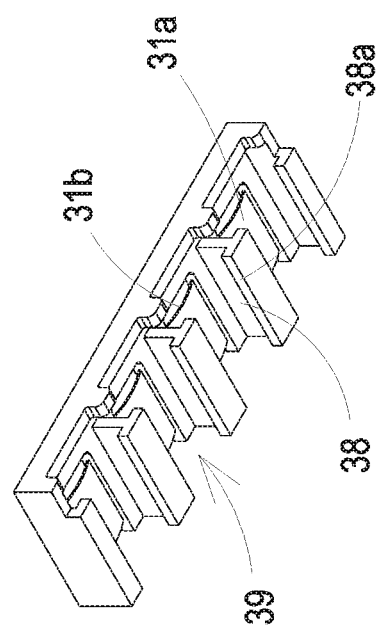
FIG. 11 is a perspective structural view illustrating the holder of the printed circuit board assembly according to the third preferred embodiment of the present invention.

FIG. 9 is an exploded view illustrating a printed circuit board assembly according to a third preferred embodiment of the present invention wherein the printed circuit board is omitted, FIG. 10 is a perspective structural view illustrating the printed circuit board assembly according to the third preferred embodiment of the present invention wherein the printed circuit board is omitted, and FIG. 11 is a perspective structural view illustrating the holder of the printed circuit board assembly according to the third preferred embodiment of the present invention. In the embodiment, the structures, elements and functions of the assembly 1b are similar to those of the assembly 1a of FIGS. 5 to 7, and are not redundantly described herein. In the embodiment, the assembly 1b includes a printed circuit board 10 (referring to FIG. 5), at least one electronic device 20, a holder 30b and a heat-dissipation device 40. Different from the assembly 1a of FIGS. 5 to 7, in the embodiment, the holder 30b further includes a pushing piece 31b configured to construct the supporting surface 31a. The pushing piece 31b can be for example but not limited to a resilient sheet, a spring, an adjustment screw and so on. The electronic device 20 includes two lateral sides 25 connected between the first surface 21 and the second surface 22, and the at least one pin 23 is disposed between the two lateral sides 25. The heat-dissipation device 40 further includes at least two receiving portions 48 disposed at two opposite sides of the heat-dissipation surface 41. On the other hand, the holder 30b further includes at least two extending portions 38 extended from the supporting surface 31a constructed by the pushing piece 31b and along the two lateral sides 25 of the electronic device 20, and bent portions 38a located at the front end of the at least two extending portions 38 are attached to the at least two corresponding receiving portions 48 of the heat-dissipation device 40, respectively. The pushing piece 31b and the at least two extending portions 38 of the holder 30b are constructed together to form a receiving seat 39 to receive the electronic device 20 and attach the second surface 22 of the electronic device 20 to the heat-dissipation surface 41 of the heat-dissipation device 40. In the embodiment, the electronic device 20 to be heat-dissipated is sustained by the holder 30b. The pins 23 of the electronic device 20 are bent and pass through the first through holes 11 of the printed circuit board 10 (referring to FIGS. 5 to 7) to pre-dispose the electronic device 20 on the printed circuit board 10. Then, the pins 23 of the electronic device 20 are fixed on the printed circuit board 10 by for example but not limited to a soldering method. Consequently, the electronic device 20 is maintained at a fixed position to prevent the pins 23 of the electronic device 20 from generating the stress and being damaged while the electronic device 20 is attached to the heat-dissipation surface 41 of the heat-dissipation device 40. Thus, the purposes of the high density package and the effective heat-dissipation are achieved.

It is noted that the front-end bent portions 38a of the at least two extending portions 38 of the holder 30b are correspondingly attached to the at least two receiving portions 48. The thickness of the bent portions 38a is substantially the same as the height difference between the heat-dissipation surface 41 and the bottom surface of the receiving portions 48 of the heat-dissipation device 40. While the pushing piece 31b and the extending portions 38 of the holder 30b are configured to receive the electronic devices 20 with the different dimensional tolerances, the first surface 21 of the electronic device 20 is pushed by the supporting surface 31a constructed by the pushing piece 31b. Consequently, the second surface 22 of the electronic device 20 is attached to the front-end bent portions 38a of the two extending portions 38 and the heat-dissipation surface 41. Therefore, the holder 30b provides not only the function of supporting the electronic devices 20 but also the function of adjusting the dimensional tolerances of the electronic devices 20.

According to the assemblies 1, 1a, 1b of the above embodiments, the present invention further provides the assembling method of the printed circuit board assembly. FIG. 12 is a flow chart of an assembling method of a printed circuit board assembly according to a preferred embodiment of the present invention. Please refer to FIGS. 1 to 3, 5 to 7, 9 to 11 and 12, the assembling method of the printed circuit board assembly includes the following steps. Firstly, as shown in the step S1 of FIG. 12, a printed circuit board 10, at least one electronic device 20, a holder 30, 30a, 30b and a heat-dissipation device 40 are provided. The printed circuit board 10 includes at least one first through hole 11. The electronic device 20 includes a first surface 21, a second surface 22 and at least one pin 23. The first surface 21 and the second surface 22 are opposite to each other. The holder 30, 30a, 30b includes a supporting surface 31, 31a. Afterward, the holder 30, 30a, 30b is placed on the printed circuit board 10, the first surface 21 of the electronic device 20 is attached to the supporting surface 31, 31a of the holder 30, 30a, 30b, and the pins 23 of the electronic device 20 are partially inserted through the first through holes 11 of the printed circuit board 10. Consequently, the holder 30, 30a, 30b is disposed between the printed circuit board 10 and the first surface 21 of the electronic device 20 and sustains the first surface 21 of the electronic device 20, as shown in the step S2 of FIG. 12. Then, the pins 23 of the electronic device 20 are firmly fixed on the printed circuit board 10 by for example but not limited to a soldering method, as shown in the step S3 of FIG. 12. Thus, the electronic device 20 is sustained by the holder 30, 30a, 30b to be maintained at a fixed position so as to prevent the pins 23 of the electronic device 20 from generating the stress and being damaged.

In the embodiment, the assembling method of the printed circuit board assembly further includes a step of fastening the printed circuit board 10 on the heat-dissipation device 40, as shown in the step S4 of FIG. 12. At the meantime, the second surface 22 of the electronic device 20 is attached to the heat-dissipation surface 41. In the embodiment, the printed circuit board 10 includes at least one first fastening component 15 and the heat-dissipation device 40 includes at least one second fastening component 47. The first fastening component 15 and the second fastening component 47 are a through hole and a screw hole, respectively, and fasten the printed circuit board 10 on the heat-dissipation device 40 by a screw (not shown). Certainly, the first fastening component 15 and the second fastening component 47 can also fasten the printed circuit board 10 on the heat-dissipation device 40 by a hook, a latch, a buckle, an adhesive tape, or other fastening means. The present invention is not limited thereto and other applicable techniques are not redundantly described herein. It should be emphasized that the electronic device 20 can be sustained effectively by the holder 30, 30a, 30b to maintain the electronic device 20 at a fixed position. While the holder 30, 30a, 30b is disposed between the printed circuit board 10 and the first surface 21 of the electronic device 20 and sustains the electronic device 20, the pins 23 of the electronic device 20 are pre-inserted through the first through holes 11 of the printed circuit board 10. Furthermore, the pins 23 of the electronic device 20 can be fixed on the printed circuit board 10 by for example but not limited to a soldering method after the printed circuit board 10 is fastened on the heat-dissipation device 40. The assembling procedures are adjustable according to the real requirements. On the other hand, the heat-dissipation device 40 is further thermally coupled to a liquid-cooled heat-exchange module 42 or a heat sink 43 through the heat-dissipation surface 41 for effectively dissipating the heat generated by the electronic device 20 through the second surface 22 and avoiding the high-temperature heat accumulation to damage the electronic device 20.

In addition, it is noted that the electronic device 20 of the present invention is sustained by the holder 30, 30a, 30b so as to pre-insert the pins 23 of the electronic device 20 through the first through holes 11 of the printed circuit board 10. At the meantime, the first positioning portion 24 of the electronic device 20 is engaged with and the second positioning portion 34 of the holder 30, 30a so as to pre-dispose the electronic device 20 on the holder 30, 30a. Then, while the printed circuit board 10 and the holder 30, 30a are assembled together, the pins 23 of the electronic device 20 pass through the first through holes 11 of the printed circuit board 10, and the electronic device 20, the holder 30, 30a and the printed circuit board 10 are maintained at the fixed positions. Since the electronic device 20, the holder 30, 30a and the printed circuit board 10 are maintained at the fixed positions, while the pins 23 of the electronic device 20 are firmly soldered on the printed circuit board 10, there is no stress generated at the solder joints between the pins 23 and the printed circuit board 10. Certainly, the electronic device 20 can be pre-disposed in the receiving seat 39 constructed by the pushing piece 31b and the two extending portions 38 of the holder 30b. Then, the holder 30b with the pre-disposed electronic device 20 is fixed on the printed circuit board 10 by for example but not limited to a screw, a hook, a latch, a buckle, an adhesive tape, or other fastening means. At the meantime, the pins 23 of the electronic device 20 pass through the first through holes 11 and pre-inserted on the printed circuit board 10. Similarly, since the electronic device 20, the holder 30b and the printed circuit board 10 are maintained at the fixed positions, while the pins 23 of the electronic device 20 are soldered on the printed circuit board 10, there is no stress generated at the solder joints between the pins 23 and the printed circuit board 10.

It should be emphasized that, in the assembling method of the printed circuit board assembly, the electronic device 20, the holder 30, 30a, 30b and the printed circuit board 10 are maintained at the fixed positions before the pins 23 of the electronic device 20 are fixed on the printed circuit board 10 by for example but not limited to a soldering method. Then, while the pins 23 of the electronic device 20 are firmly soldered on the printed circuit board 10, there is no stress generated. On the other hand, since the electronic device 20, the holder 30, 30a, 30b and the printed circuit board 10 are maintained at the fixed positions, while the electronic device 20 is attached to the heat-dissipation surface 41 of the heat-dissipation device 40 directly or by the thermally conductive adhesive 50, there is no stress generated at the joints between the pins 23 and the printed circuit board 10 so as to avoiding the damage. In addition, while the holder 30, 30a, 30b is disposed between the printed circuit board 10 and the first surface 21 of the electronic device 20 and sustains the first surface 21 of the electronic device 20, the pins 23 of the electronic device 20 are inserted through the first through holes 11 of the printed circuit board. No matter whether the printed circuit board 10 is fixed on the heat-dissipation device 40 in advance, the pins 23 of the electronic device 20 can be fixed on the printed circuit board 10 by for example but not limited to a soldering method to avoid generating any stress at the joints between the pins 23 and the printed circuit board 10 and thus avoid the damage. The present invention is not limited to the above illustrative embodiments, and the assembling sequences are adjustable according to the real requirements and not redundantly described herein.

In summary, the present disclosure provides a printed circuit board assembly and an assembling method thereof. By disposing a holder between the printed circuit board and the heat-dissipation device, the electronic device on the printed circuit board is correspondingly attached to the heat-dissipation surface of the heat-dissipation device to dissipate heat. It is easy to assemble the electronic device, the holder, the printed circuit board and the heat-dissipation device, and the holder is provided with sufficient strength to support the electronic device to be heat-dissipated after the assembling structure has been completely assembled. Consequently, the stress generated from the pins of the electronic device is eliminated and the electronic device is maintained at a fixed position. In addition, the printed circuit board can provide sufficient available area for other electronic components to be arranged unrestrictedly, so that the assembling structure of the printed circuit board and the heat-dissipation device is provided to achieve the purposes of effective heat-dissipation and high-density structure. Moreover, by disposing a holder between the printed circuit board and the heat-dissipation device, the electronic device is sustained by the holder firstly. Thus, while the pins of the electronic device are inserted on the printed circuit board and the electronic device is attached to the heat-dissipation surface of the heat-dissipation device, the stress generated from the pins of the electronic device is eliminated and the electronic device is maintained at a fixed position. In the meantime, the space between the printed circuit board and the heat-dissipation device is integrated by the holder for improving the space utilization. Consequently, the assembling structure of the printed circuit board and the heat-dissipation device is provided to achieve the purposes of effective heat-dissipation and high-density structure.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A printed circuit board assembly comprising:
   a printed circuit board comprising at least one first through hole;
   at least one electronic device comprising a first surface, a second surface and at least one pin, wherein the first surface and the second surface are opposite to each other, and the pin passes through the first through hole of the printed circuit board and is inserted on the printed circuit board, wherein the pin is inserted perpendicularly on the printed circuit board and bent such that a body of the electronic device is inclined at an angle relative to the perpendicularly inserted pin;
   a holder secured to the printed circuit board and disposed between the printed circuit board and the electronic device, wherein the holder comprises a supporting surface sustaining the first surface of the electronic device, and wherein the holder is configured to provide an accommodation space between the supporting surface and the printed circuit board, wherein the supporting surface of the holder comprises an inclined plane corresponding to the inclined body of the electronic device and configured to sustain the first surface of the electronic device, and wherein the angle is less than 90 degrees; and
   a heat-dissipation device comprising a heat-dissipation surface thermally coupled with the second surface of the electronic device.

2. The printed circuit board assembly according to claim 1, wherein the holder is secured to the printed circuit board by attachment means not comprising soldering.

3. The printed circuit board assembly according to claim 1, wherein the holder comprises a fastening set jointing the holder with the printed circuit board, the fastening set comprises at least one fastening hole and at least one fastening piece, the printed circuit board comprises at least one second through hole, and the fastening piece is engaged with the fastening hole on the holder through the second through hole and joints the holder with the printed circuit board.

4. The printed circuit board assembly according to claim 1, wherein the electronic device further comprises a first positioning portion disposed on the first surface, the holder further comprises a second positioning portion disposed on the supporting surface, and wherein the supporting surface of the holder sustains the first surface of the electronic device, the first positioning portion and the second positioning portion are engaged with each other.

5. The printed circuit board assembly according to claim 4, wherein the first position portion comprises an indent and the second position portion comprises a projection engaged with the indent of the first position portion.

6. The printed circuit board assembly according to claim 1, wherein the printed circuit board comprises a second through hole, wherein the holder comprises a fastening hole configured to receive an elongate fastening piece inserted through the second through hole of the printed circuit board, wherein the fastening piece comprises a flange disposed at one end such that when the fastening piece is inserted into the fastening hole, the flange abuts against the printed circuit board to secure the holder to the printed circuit board.

7. The printed circuit board assembly according to claim 1, wherein the holder is trapezoidal shaped.

8. The printed circuit board assembly according to claim 1, wherein the printed circuit board comprises at least one first fastening component and the heat-dissipation device comprises at least one second fastening component, and the first fastening component and the second fastening component are corresponding to each other and configured to fasten the printed circuit board on the heat-dissipation device.

9. The printed circuit board assembly according to claim 8, wherein the heat-dissipation device is a casing configured to enclose the electronic device and the holder with the printed circuit board fastened on the heat-dissipation device.

10. An electronic assembly for use with a printed circuit board and configured to couple with a heat dissipation device, the electronic assembly comprising:
    at least one electronic device comprising a first surface, a second surface and at least one pin, wherein the first surface and the second surface are opposite to each other, and the pin is configured to pass through a first through hole of the printed circuit board and inserted on the printed circuit board, wherein a thermally conductive adhesive is provided on the second surface of the electronic device for attaching the second surface of the electronic device to a heat-dissipation surface of the heat-dissipation device, wherein the pin is inserted perpendicularly on the printed circuit board and bent such that a body of the electronic device is inclined at an angle relative to the perpendicularly inserted pin; and
    a holder disposed between the printed circuit board and the electronic device, wherein the holder comprises a supporting surface sustaining the first surface of the electronic device and the holder further comprising an accommodation space provided between the supporting surface and the printed circuit board, and wherein the holder is configured to be secured to the printed circuit board, wherein the supporting surface of the holder comprises an inclined plane corresponding to the inclined body of the electronic device and configured to sustain the first surface of the electronic device, and wherein the angle is less than 90 degrees.

11. The electronic assembly according to claim 10, wherein the holder is secured to the printed circuit board by attachment means not comprising soldering.

12. The electronic assembly according to claim 10, wherein the holder comprises a fastening set jointing the holder with the printed circuit board, the fastening set comprises at least one fastening hole and at least one fastening piece, and the fastening piece is engaged with the fastening hole on the holder through a second through hole of the printed circuit board and joints the holder with the printed circuit board.

13. The electronic assembly according to claim 12, wherein the fastening hole is disposed on a body of the holder and the fastening piece is elongate and partially disposed in the fastening hole, and wherein the fasten piece comprises a flange being disposed outside the fastening hole and configured to abut against the printed circuit board.

14. The electronic assembly according to claim 10, wherein the electronic device further comprises a first positioning portion disposed on the first surface, the holder further comprises a second positioning portion disposed on the supporting surface, and wherein the first positioning portion and the second positioning portion are engaged with each other to position the supporting surface of the holder to sustain the first surface of the electronic device.

15. The electronic assembly according to claim 14, wherein the first position portion comprises a hollow and the second position portion comprises a protrusion disposed in the hollow of the first position portion.

16. The electronic assembly according to claim 10, wherein the holder is trapezoidal shaped.

17. The electronic assembly according to claim 10, wherein the holder is configured to be secured to the printed circuit board such that the holder body extends perpendicularly from the printed circuit board.

18. The electronic assembly according to claim 10, wherein the holder further comprises a side edge extending adjacent to the supporting surface, and wherein the side edge is disposed proximal to the pin of the electronic device and faces towards the pin of the electronic device.

* * * * *